(12) United States Patent
Yang et al.

(10) Patent No.: US 11,837,309 B2
(45) Date of Patent: Dec. 5, 2023

(54) PROCESSING METHOD OF CHIP PROBING DATA AND COMPUTER-READABLE STORAGE MEDIUM

(71) Applicant: CHANGXIN MEMORY TECHNOLOGIES, INC., Hefei (CN)

(72) Inventors: Lei Yang, Hefei (CN); Yui-Lang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 193 days.

(21) Appl. No.: 17/455,913

(22) Filed: Nov. 20, 2021

(65) Prior Publication Data
US 2022/0076774 A1 Mar. 10, 2022

Related U.S. Application Data

(63) Continuation of application No. PCT/CN2021/100627, filed on Jun. 17, 2021.

(30) Foreign Application Priority Data
Aug. 28, 2020 (CN) .......................... 202010883139.0

(51) Int. Cl.
*G11C 29/44* (2006.01)
*G11C 29/00* (2006.01)
(Continued)

(52) U.S. Cl.
CPC .......... *G11C 29/4401* (2013.01); *G11C 29/18* (2013.01); *G11C 29/38* (2013.01); *G11C 29/785* (2013.01)

(58) Field of Classification Search
CPC .............................. G11C 29/4401; G11C 29/44
(Continued)

(56) References Cited

U.S. PATENT DOCUMENTS

2007/0288219 A1* 12/2007 Zafar .................... G03F 1/84
703/14
2013/0231769 A1 9/2013 Tien et al.
(Continued)

FOREIGN PATENT DOCUMENTS

CN 104050308 A 9/2014
CN 107039074 A 8/2017
(Continued)

OTHER PUBLICATIONS

English translation of the Written Opinion of the International Search Authority in the international application No. PCT/CN2021/100627, dated Sep. 15, 2021.
(Continued)

*Primary Examiner* — Muna A Techane
(74) *Attorney, Agent, or Firm* — SYNCODA LLC; Feng Ma

(57) ABSTRACT

A processing method of chip probing data includes: determining a new fail bit generated in an already completed chip probing process; acquiring repair record of the new fail bit, and repair records of bits adjacent to the new fail bit; analyzing the repair records to determine attribute information of the new fail bit and the adjacent bits, the attribute information including at least one of address information, redundant circuit information, element pattern of the new fail bit and chip probing flow; performing classification learning according to the attribute information to acquire a fail bit prediction model; and predicting fail bits to be chip-probed through the fail bit prediction model.

16 Claims, 10 Drawing Sheets

(51) Int. Cl.
  *G11C 29/38* (2006.01)
  *G11C 29/18* (2006.01)
(58) Field of Classification Search
  USPC .................................................. 365/189.05
  See application file for complete search history.

(56) References Cited

U.S. PATENT DOCUMENTS

| 2017/0221564 | A1  | 8/2017  | Okada et al. |
| 2019/0267072 | A1  | 8/2019  | Torng et al. |
| 2021/0335431 | A1* | 10/2021 | Choi ................. G11C 16/08 |

FOREIGN PATENT DOCUMENTS

| CN | 105845592 B | 11/2018 |
| CN | 110968985 A | 4/2020 |
| CN | 110991124 A | 4/2020 |

OTHER PUBLICATIONS

International Search Report (ISR) and Written Opinion in PCT/CN2021/100627 dated Sep. 15, 2021.

\* cited by examiner

PROCESSING METHOD OF CHIP PROBING DATA AND COMPUTER-READABLE STORAGE MEDIUM

CROSS-REFERENCE TO RELATED APPLICATIONS

This is a continuation of International Patent Application No. PCT/CN2021/100627 filed on Jun. 17, 2021, which claims priority to Chinese Patent Application No. 202010883139.0 filed on Aug. 28, 2020. The entire contents thereof are herein incorporated by reference.

BACKGROUND

The addresses of all fail bits (abbreviated as "FBs") would be repaired during the circuit probing (also referred to as "chip probing") phase, and such repair of the FBs is referred to as "general repair" in this paper.

SUMMARY

The present disclosure relates to the technical field of chip fabrication, and more specifically to a processing method of chip probing data and a computer-readable storage medium.

An objective of the present disclosure is to provide a processing method of chip probing data and a computer-readable storage medium to overcome the prior-art problem of low efficiency for probing fail bits of wafers at least to a certain extent.

Other characteristics and advantages of the present disclosure will become apparent through the following detailed description, or be partially learned through implementation of the present disclosure.

According to one aspect of the present disclosure, there is provided a processing method of chip probing data, which method comprises determining a new fail bit generated in an already completed chip probing process; acquiring repair record of the new fail bit, and repair records of bits adjacent to the new fail bit; analyzing the repair records to determine attribute information of the new fail bit and the adjacent bits, the attribute information including at least one of address information, redundant circuit information, element pattern of the new fail bit and chip probing flow; performing classification learning according to the attribute information to acquire a fail bit prediction model; and predicting fail bits to be chip-probed through the fail bit prediction model.

According to another aspect of the present disclosure, there is provided a computer-readable storage medium, storing thereon a computer program that realizes the processing method of chip probing data according to anyone of the aforementioned items upon execution by a processor.

As should be understood, the foregoing general description and the following detailed description are merely exemplary and explanative in nature, and do not constitute any restriction to the present disclosure.

BRIEF DESCRIPTION OF THE DRAWINGS

The accompanying drawings here are incorporated into the Description, constitute part of the Description, illustrate the embodiments in conformity with the present disclosure, and explain the principles of the present disclosure together with the Description. Apparently, the drawings accompanying the following description are merely directed to some embodiments of the present disclosure, and persons ordinarily skilled in the art may further base on these accompanying drawings to acquire other drawings without spending creative effort in the process.

DETAILED DESCRIPTION

Figure 1A:
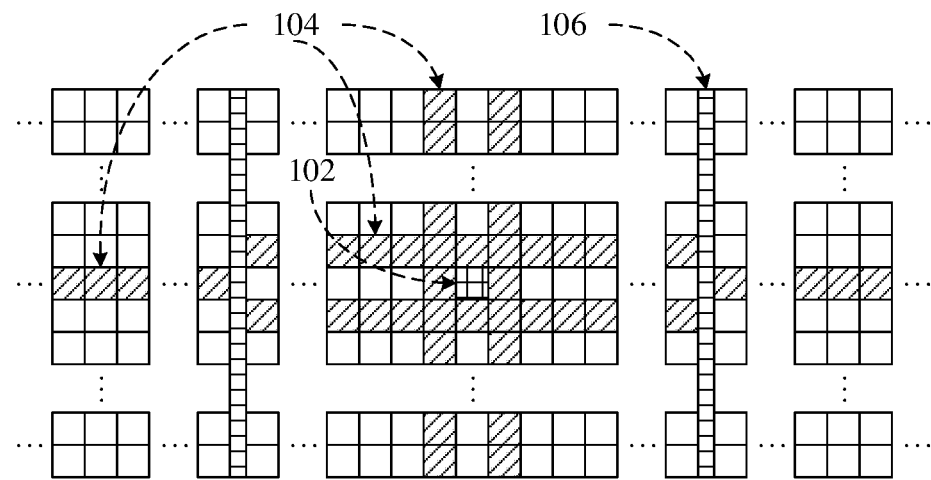
FIG. 1A is a diagram schematically illustrating a chip probing process in some embodiments of the present disclosure.

The exemplary embodiments will be described more comprehensively with reference to the accompanying drawings. However, the exemplary embodiments can be implemented in many forms, and shall not be understood to be restricted to the scope enunciated here. To the contrary, provision of the embodiments makes the present disclosure more comprehensive and complete, and communicates the conception of the exemplary embodiments wholly to persons skilled in the art. The described features, structures or characteristics can be combined in one or more embodiments in any suitable manner.

In addition, the accompanying drawings are merely schematic illustrations of the present disclosure, and are not necessarily drawn to scale. Identical reference numerals in the drawings indicate the same or similar parts, so repetitive descriptions thereof will not be made in this context. Certain block diagrams shown in the drawings indicate functional entities that are not necessarily corresponding to physically or logically independent entities. These functional entities can be realized by software, or in one or more hardware module(s) or integrated circuit(s), or in different networks and/or processor apparatuses and/or microcontroller apparatuses.

Some non FBs' addresses might also be repaired, and it is most probable that new fail bits might occur in the non FBs' addresses in several test procedures after the "general repair". Accordingly, these non FBs' addresses would be repaired together after the general repair, and such repair is referred to as "predictive repair".

Since circuit wirings on wafers are mostly micron-grade or nanometer-grade, determination of fail bits per one-by-one exclusion through manual screening or probes not only causes low chip probing efficiency and affects the yield of wafer products, but may also affect the acceptance rate of wafer products due to new fail elements generated in the probing flow.

Various embodiments the present disclosure can enhance the efficiency for detecting fail bits of wafers and improves yield and acceptance rate of wafers by acquiring repair records of new fail bits generated in the chip probing process and adjacent bits, and by performing classification learning on the basis of the two types of repair records, so as to base on the classification learning result to predict fail bits, in other words, provided is a processing solution of chip probing data that is highly efficient and highly reliable.

The processing solution of chip probing data provided by the embodiments of the present disclosure relates to such techniques as chip probing and classification learning, and is specifically described through the following embodiments.

Figure 1B:
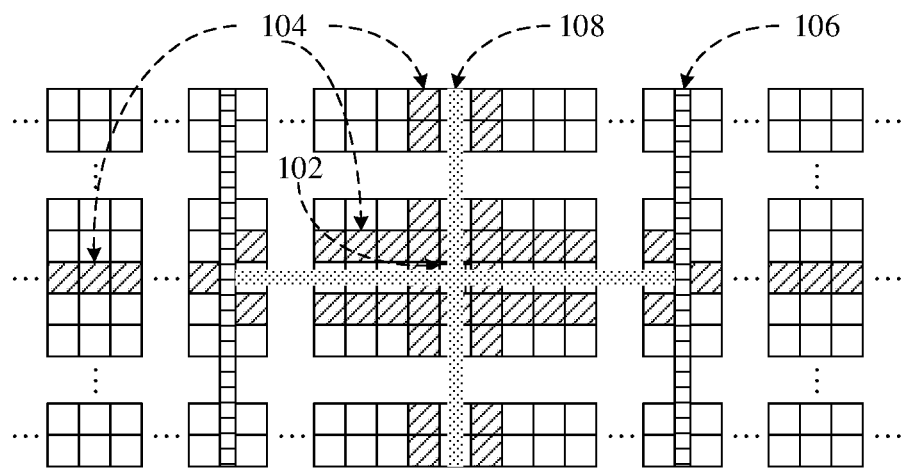
FIG. 1B is a diagram schematically illustrating another chip probing process in some embodiments of the present disclosure.
Figure 1C:
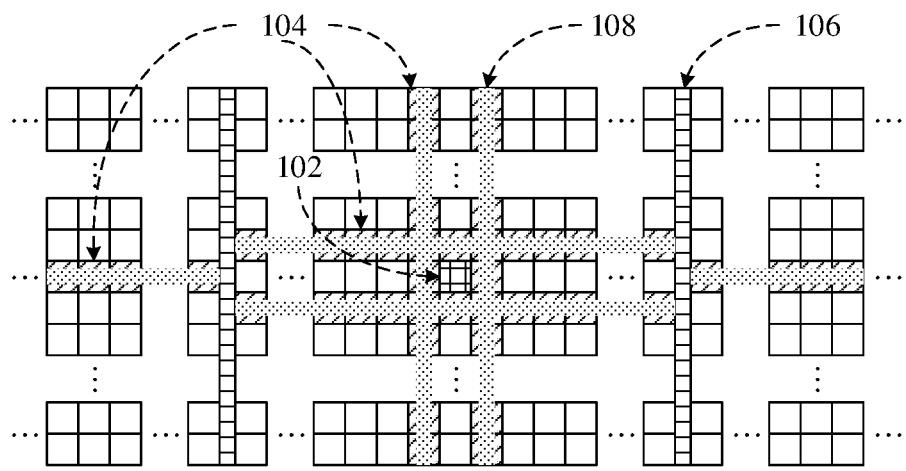
FIG. 1C is a diagram schematically illustrating yet another chip probing process in some embodiments of the present disclosure.

As shown in FIGS. 1A, 1B and 1C, functional regions on a wafer are divided by groove 106 into plural sections, some addresses would affect other effective bits after they are repaired by redundant circuit, whereby the other effective bits become new fail bits; in FIGS. 1A, 1B and 1C a new fail bit 102 is singled out from the new fail bits as an object of analysis, and this new fail bit 102 can be referred to as an observed new fail bit (ONFB).

The reason for the occurrence of new fail bits might be attributed to repair, and might also be attributed to the fail bits in the original repaired address 108. The repaired bits that might affect other effective bits to become new fail bits are referred to as "associate bit(s) 104" in the present disclosure.

As shown in FIGS. 1A, 1B and 1C, the address of the new fail bit 102 is represented by (x, y), and the associate bits 104 are bits mainly determined according to the new fail bit 102 and the repaired address 108; specifically, the associate bits 104 include the following addresses:

As shown in FIG. 1A, the step of determining adjacent bits as associate bits 104 in an embodiment of the present disclosure includes: creating a reference coordinate system with coordinates of a bit at a lower left corner of the wafer as original coordinates; basing on the reference coordinate system to determine as x a horizontal coordinate of a row at which the new fail bit locates, and to determine as y a longitudinal coordinate of a column at which the new fail bit locates, x and y both being positive integers; and determining all bits of a column whose horizontal coordinate is x−1 and all bits of a column whose horizontal coordinate is x+1 as the adjacent bits.

As shown in FIG. 1A, all bit addresses between address (x−1,0) and address (x−1,$y_{max}$), and all bit addresses between address (x+1,0) and address (x+1,$y_{max}$).

As shown in FIG. 1B, the step of determining adjacent bits as associate bits 104 in another embodiment of the present disclosure includes: creating a reference coordinate system with coordinates of a bit at a lower left corner of the wafer as original coordinates; basing on the reference coordinate system to determine as x a horizontal coordinate of a row at which the new fail bit locates, and to determine as y a longitudinal coordinate of a column at which the new fail bit locates, x and y both being positive integers; determining as N a serial number of a section to which the new fail bit pertains; determining as $x_0^N$ a horizontal coordinate of a bit at a left boundary of the section to which the new fail bit pertains; determining as $x_{max}^N$ a horizontal coordinate of a bit at a right boundary of the section to which the new fail bit pertains; and determining all bits whose longitudinal coordinate is y−1 and whose horizontal coordinate is $x_0^N$ to $x_{max}^N$, and all bits whose longitudinal coordinate is y+1 and whose horizontal coordinate is $x_0^N$ to $x_{max}^N$ as the adjacent bits.

As shown in FIG. 1B, all bit addresses between address ($x_0^N$, y−1) and address ($x_{max}^N$, y−1), and all bit addresses between address ($x_0^N$, y+1) and address ($x_{max}^N$, y+1).

As shown in FIG. 1C, the step of determining adjacent bits as associate bits 104 in another embodiment of the present disclosure includes: creating a reference coordinate system with coordinates of a bit at a lower left corner of the wafer as original coordinates; basing on the reference coordinate system to determine as x a horizontal coordinate of a row at which the new fail bit locates, and to determine as y a longitudinal coordinate of a column at which the new fail bit locates, x and y both being positive integers; determining as N−1 a serial number of a section to the left of a section to which the new fail bit pertains; determining as N+1 a serial number of a section to the right of a section to which the new fail bit pertains; determining as $x_0^{N-1}$ a horizontal coordinate of a bit at a left boundary of the left section; determining as $x_{max}^{N-1}$ a horizontal coordinate of a bit at a right boundary of the left section; determining as $x_0^{N+1}$ a horizontal coordinate of a bit at a left boundary of the right section; determining as $x_{max}^{N+1}$ a horizontal coordinate of a bit at a right boundary of the right section; and determining all bits whose longitudinal coordinate is y and whose horizontal coordinate is $x_0^{N-1}$ to $x_{max}^{N-1}$, and all bits whose horizontal coordinate is $x_0^{N+1}$ to $x_{max}^{N+1}$ as the adjacent bits.

As shown in FIG. 1C, all bit addresses between address ($x_0^{N-1}$, y) and address ($x_{max}^{N-1}$, y), and all bit addresses between address ($x_0^{N+1}$, y) and address ($x_{max}^{N+1}$, y).

The origin of the x-y axis is determined with reference to the bit at a lower left corner of the wafer, and N is an integer greater than 1. The new fail bit 102 is set to locate at Section N, $y_{max}$ indicates the highest address in direction y in the Section at which the new fail bit 102 locates, $x_0^N$ indicates the lowest address in direction x in Section N, and $x_{max}^N$ indicates the highest address in direction x in Section N.

The processing method of chip probing data according to an embodiment of the present disclosure is described below with reference to FIG. 2. The processing method of chip probing data shown in FIG. 2 is merely by way of example, and should not be construed as any restriction to the function and scope of application of the embodiments of the present disclosure.

Figure 2:
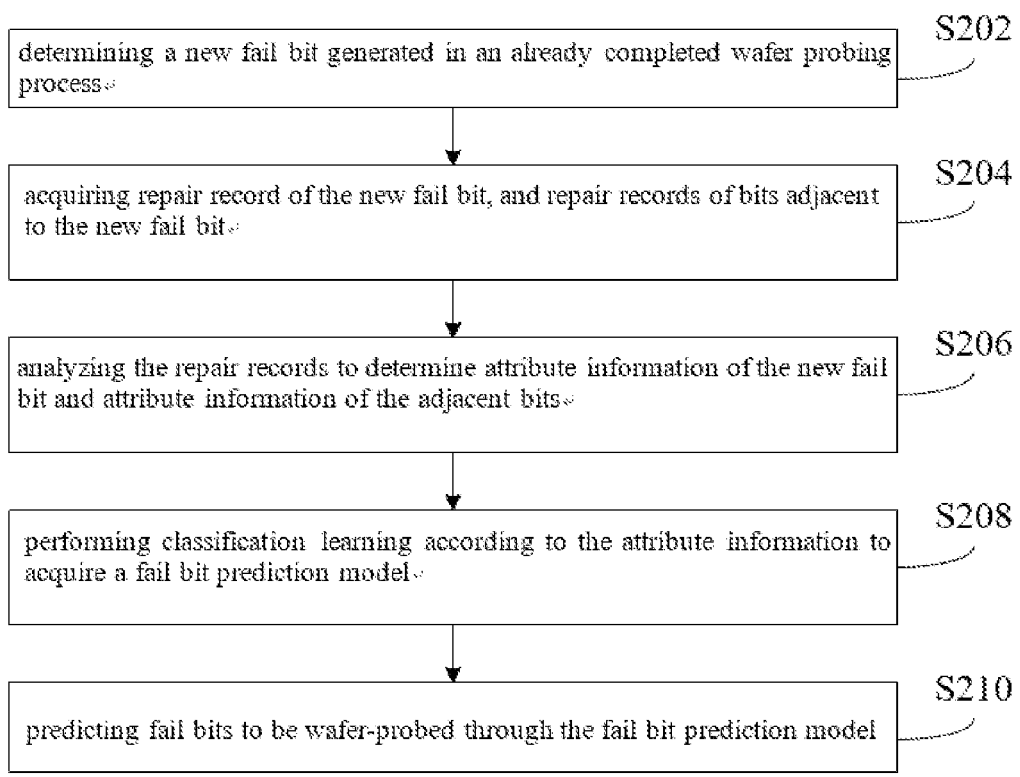
FIG. 2 is a flowchart schematically illustrating a processing method of chip probing data in some embodiments of the present disclosure.

As shown in FIG. 2, the processing method of chip probing data of the present disclosure comprises the following steps.

Step S202: determining a new fail bit generated in an already completed chip probing process.

Step S204: acquiring repair record of the new fail bit, and repair records of bits adjacent to the new fail bit.

In the aforementioned embodiment, the repair records include, but are not restricted to, the following contents:

(1) Version: version of redundant circuit repair.

(2) Repaired address.
(2.1) Chip location: (x, y) location of chips.
(2.2) Region: Bank location.
(2.3) Subdomain: data line location.
(2.4) Row address: x-axis location in data line.
(2.5) Column address: y-axis location in data line.
(3) Bin: collection of test items.
(4) Fail Bit Count: count of repaired fail bits.
(5) Redundant ID: redundant circuit ID numbering.

Step S206: analyzing the repair records to determine attribute information of the new fail bit and attribute information of the adjacent bits, the attribute information including at least one of address information, redundant circuit information, element pattern of the new fail bit and chip probing flow.

In the aforementioned embodiment, location data includes, but is not restricted to, the following contents:
(1) id: NFB ID numbering.
(2) product id: product type ID numbering.
(3) Fail Bit Address: fail bit address.
(3.1) Lot ID: lot numbers of wafers.
(3.2) Wafer No: wafer ID numbering.
(3.3) Channel id: channel ID numbering.
(3.4) Chip location: (x, y) location of chips.
(3.5) Bank id: bank ID numbering; inside a chip, the data of the memory is written in units of bits into a large matrix, in which are included plural function cells addressing with row coordinate (x-axis) and column coordinate (y-axis); this matrix is the logical bank of the chip.
(3.6) Row address: x-axis location in data line.
(3.7) Column address: y-axis location in data line.
(3.8) DQ address: data line address.

Step S208: performing classification learning according to the attribute information to acquire a fail bit prediction model.

Step S210: predicting fail bits to be chip-probed through the fail bit prediction model.

In the aforementioned embodiment, the bits adjacent to the new fail bit are the associate bits, by classifying the probing data through repair record of the new fail bit and repair records of the adjacent bits, by basing on the classified data to perform model training, and by subjecting the trained model to prediction of new fail bits, the probing efficiency, reliability, yield and acceptance rate are all enhanced.

Figure 3:
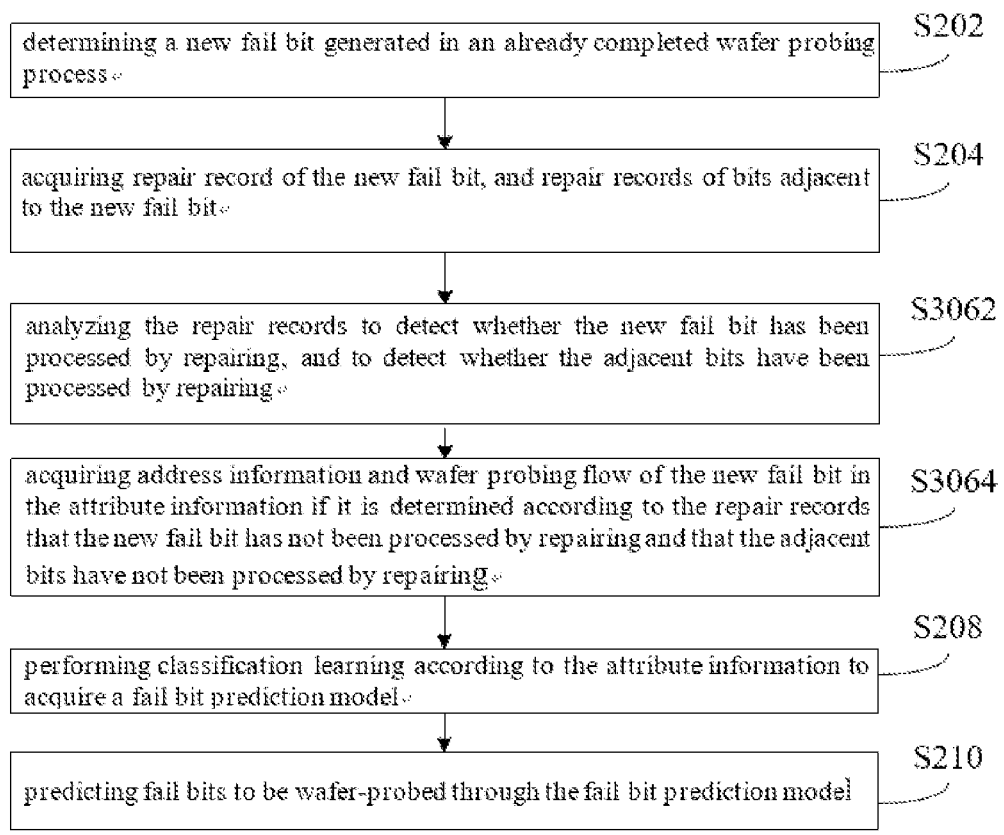
FIG. 3 is a flowchart schematically illustrating another processing method of chip probing data in some embodiments of the present disclosure.

On the basis of the method steps shown in FIG. 2, as shown in FIG. 3, the step of analyzing the repair records to determine attribute information of the new fail bit and attribute information of the adjacent bits includes the following.

Step S3062: analyzing the repair records to detect whether the new fail bit has been processed by repairing, and to detect whether the adjacent bits have been processed by repairing.

Step S3064: acquiring address information and chip probing flow of the new fail bit in the attribute information if it is determined according to the repair records that the new fail bit has not been processed by repairing and that the adjacent bits have not been processed by repairing.

In the aforementioned embodiment, by determining that none of the new fail bit and the adjacent bits has been processed by repairing (such detection result is defined as phenomenon 1), classification learning is performed on the fail reason from the aspects of address information and chip probing flow to facilitate predicting addresses of new fail bits according to the chip probing flow, whereby chip probing efficiency and reliability are enhanced.

Figure 4:
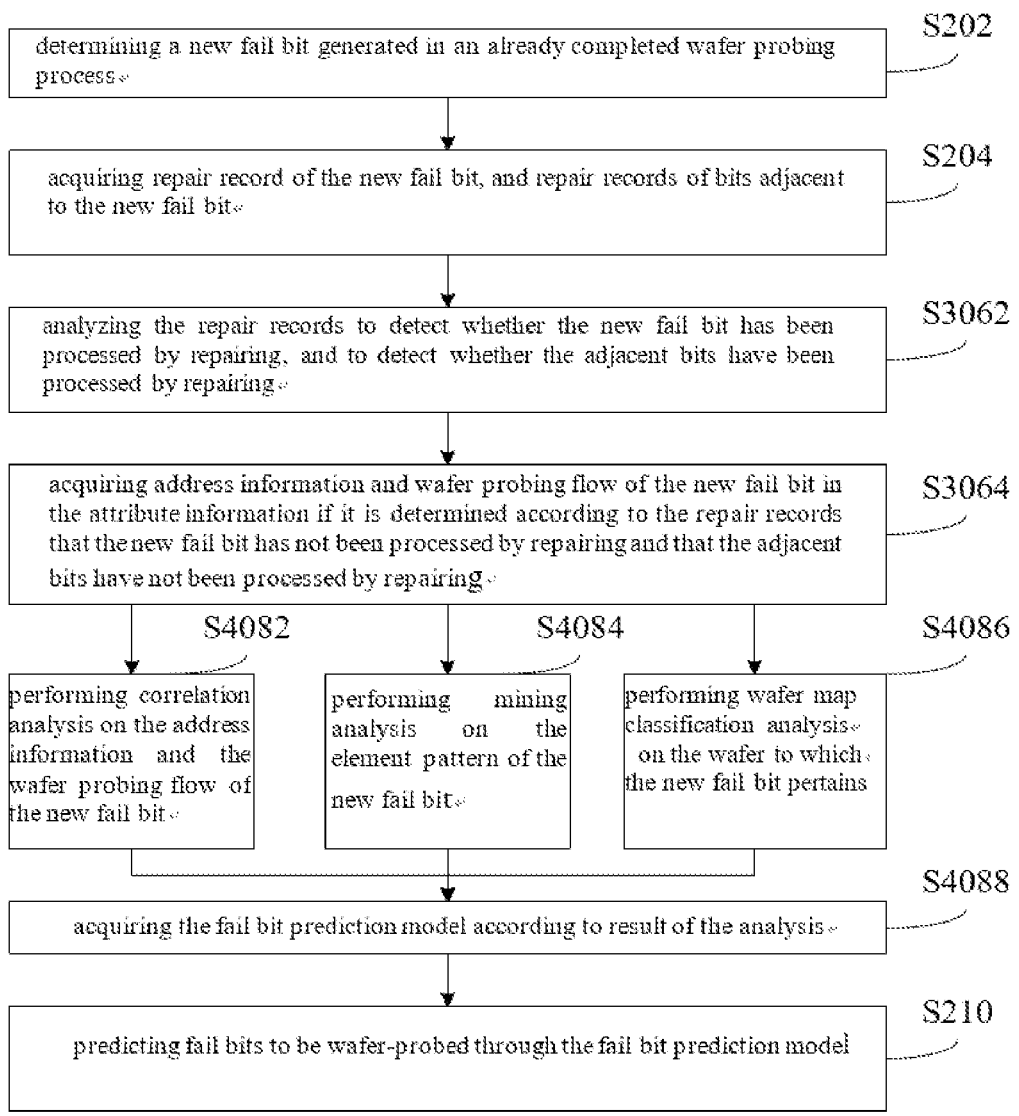
FIG. 4 is a flowchart schematically illustrating yet another processing method of chip probing data in some embodiments of the present disclosure.

On the basis of the method steps shown in FIGS. 2 and 3, as shown in FIG. 4, the step of performing classification learning according to the attribute information to acquire a fail bit prediction model includes the following.

Step S4082: performing correlation analysis on the address information and the chip probing flow of the new fail bit.

Step S4084: performing mining analysis on the element pattern of the new fail bit.

Step S4086: performing wafer map classification analysis on the wafer to which the new fail bit pertains.

Step S4088: acquiring the fail bit prediction model according to result of the analysis.

In the aforementioned embodiment, Steps S4082, S4084 and S4086 are three mutually independent classification learning processes, which respectively base on address information and chip probing flow, element pattern, and wafer map classification to perform analyses, so as to acquire the fail bit prediction model; in the subsequent chip probing process, it is possible to base on address information, chip probing flow, element pattern, and wafer map classification to predict new fail bits, whereby reliability and precision of chip probing efficiency are enhanced, and yield and acceptance rate of wafer products are improved.

Figure 5:
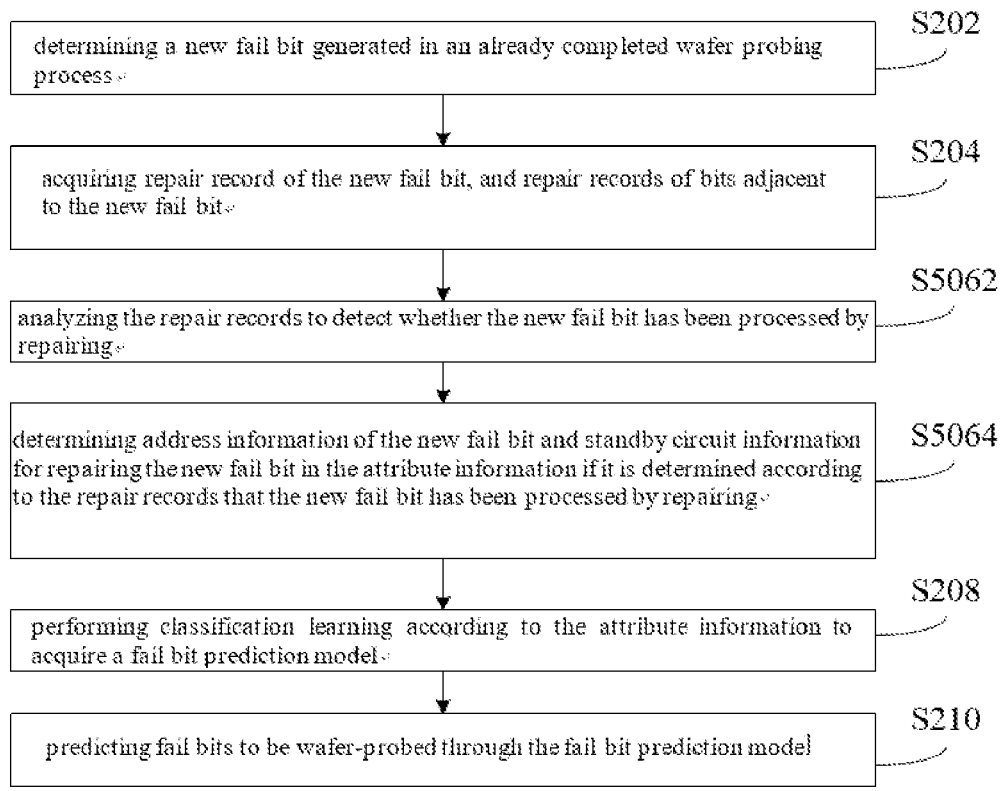
FIG. 5 is a flowchart schematically illustrating still another processing method of chip probing data in some embodiments of the present disclosure.

On the basis of the method steps shown in FIG. 2, as shown in FIG. 5, the step of analyzing the repair records to determine attribute information of the new fail bit and attribute information of the adjacent bits further includes the following.

Step S5062: analyzing the repair records to detect whether the new fail bit has been processed by repairing.

Step S5064: determining address information of the new fail bit and redundant circuit information for repairing the new fail bit in the attribute information if it is determined according to the repair records that the new fail bit has been processed by repairing.

In the above embodiment, after it is determined that the new fail bit has been processed by repairing (such detection result is defined as phenomenon 2), the inventor analyzed the main reason for generating the new fail bit likely to be the introduction of redundant circuit to repair the new fail bit, so the redundant circuit information for repairing the new fail bit is acquired for analysis.

Figure 6:
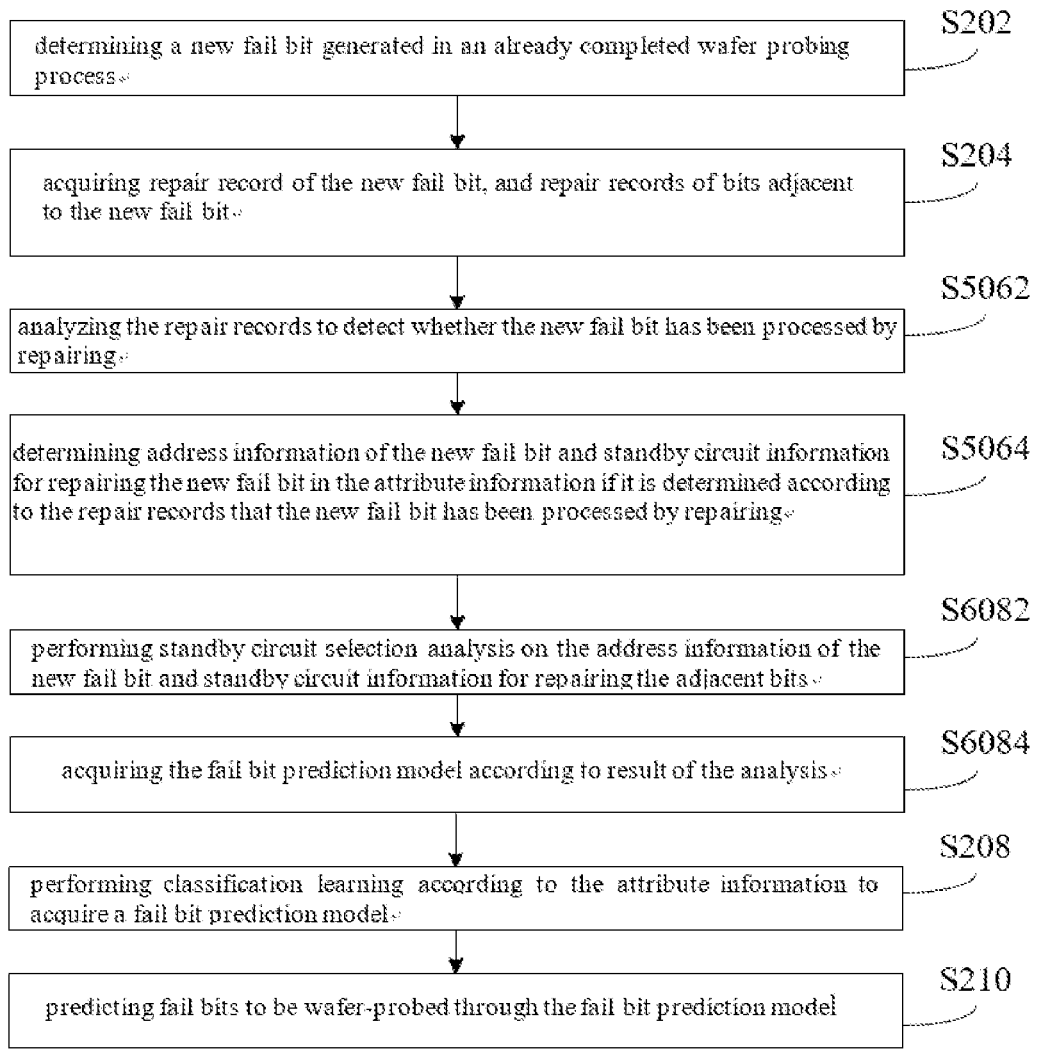
FIG. 6 is a flowchart schematically illustrating again another processing method of chip probing data in some embodiments of the present disclosure.

On the basis of the method steps shown in FIGS. 2 and 5, as shown in FIG. 6, the step of performing classification learning according to the attribute information to acquire a fail bit prediction model further includes the following.

Step S6082: performing redundant circuit selection analysis on the address information of the new fail bit and redundant circuit information for repairing the new fail bit.

Step S6084: acquiring the fail bit prediction model according to result of the analysis.

In the above embodiment, by analyzing redundant circuit selection for repairing the new fail bit, it is possible, on the one hand, to determine features of redundant circuits that are more likely to cause the generation of new fail bits so as to improve redundant circuits to hence enhance the overall reliability of the wafers, and on the other hand, when a redundant circuit is used next time to perform a repairing process, the redundant circuit information is input in the prediction model to predict addresses where new fail bits may occur, to thereby enhance chip probing reliability and precision, and to enhance yield and acceptance rate of wafers.

Figure 7:
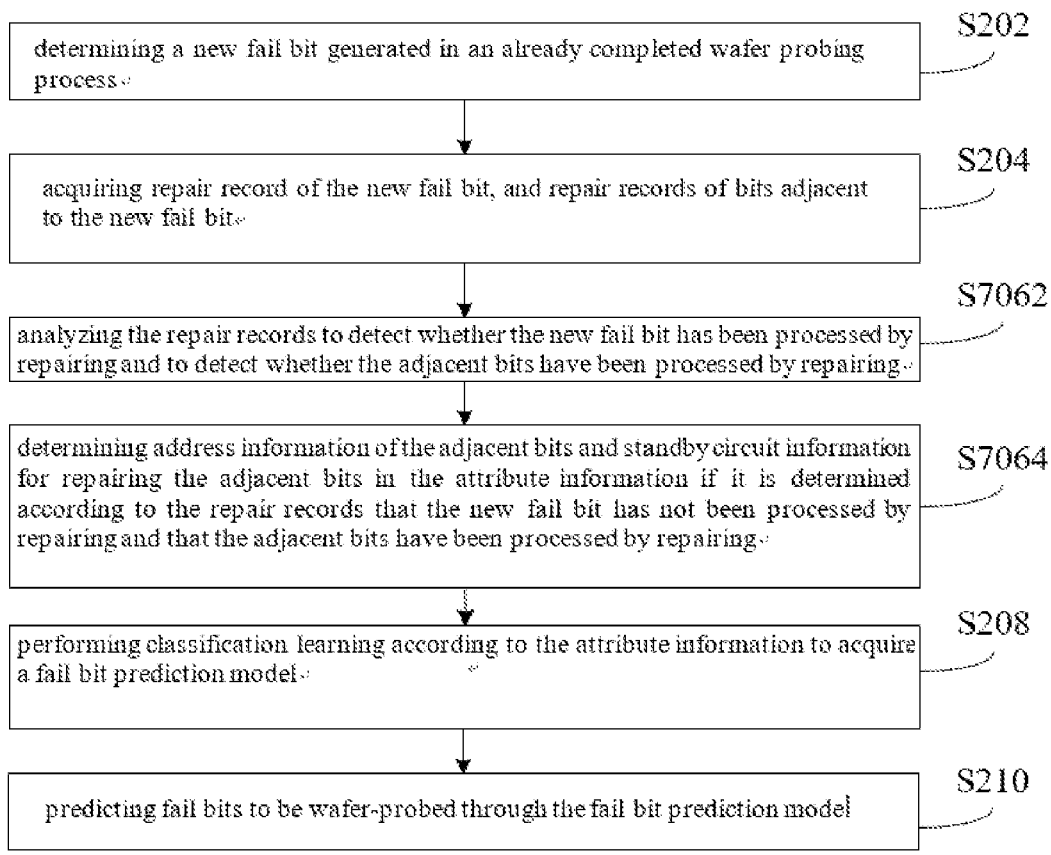
FIG. 7 is a flowchart schematically illustrating a further processing method of chip probing data in some embodiments of the present disclosure.

On the basis of the method steps shown in FIG. 2, as shown in FIG. 7, the step of analyzing the repair records to determine attribute information of the new fail bit and attribute information of the adjacent bits further includes the following.

Step S7062: analyzing the repair records to detect whether the new fail bit has been processed by repairing and to detect whether the adjacent bits have been processed by repairing.

Step S7064: determining address information of the adjacent bits and redundant circuit information for repairing the adjacent bits in the attribute information if it is determined according to the repair records that the new fail bit has not been processed by repairing and that the adjacent bits have been processed by repairing.

In the above embodiment, after it is determined that the new fail bit has not been processed by repairing and that the adjacent bits have been processed by repairing (such detection result is defined as phenomenon 3), the inventor analyzed the main reason for generating the adjacent bits to be the introduction of redundant circuit to repair the adjacent bits, so the redundant circuit information is acquired for analysis.

Figure 8:
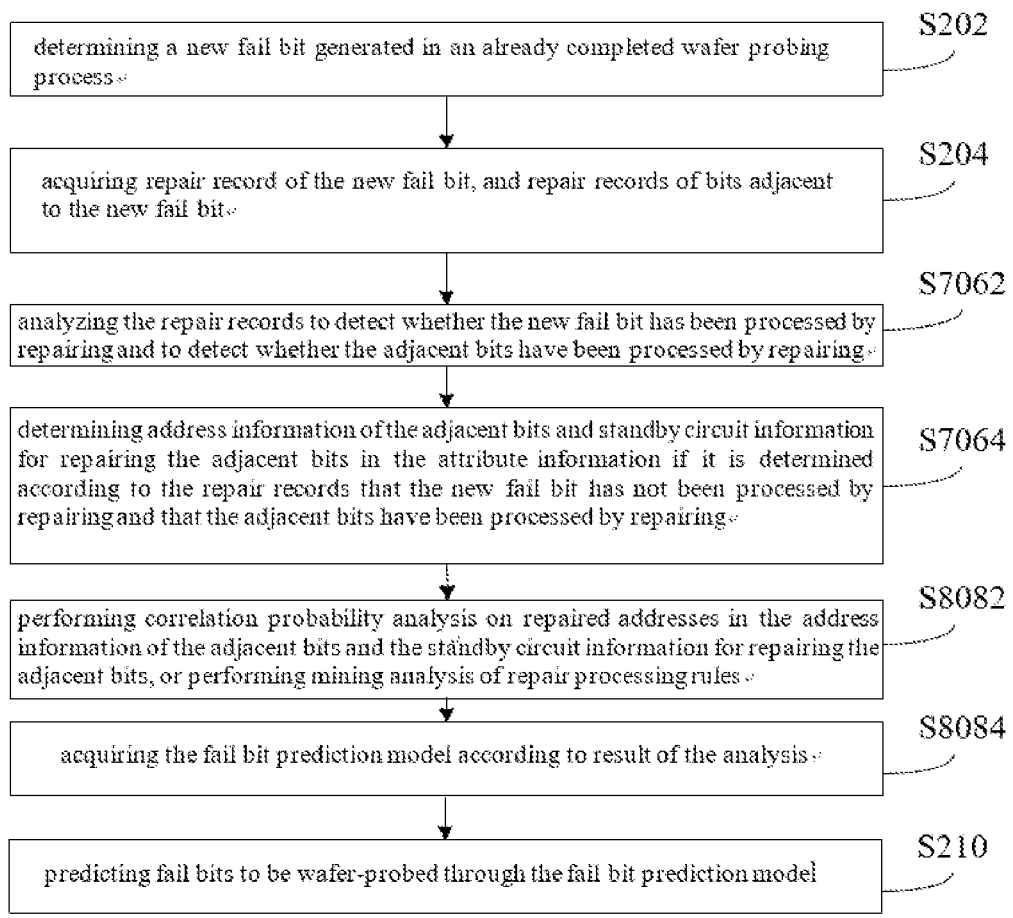
FIG. 8 is a flowchart schematically illustrating a yet further processing method of chip probing data in some embodiments of the present disclosure.

On the basis of the method steps shown in FIGS. 2 and 7, as shown in FIG. 8, the step of performing classification learning according to the attribute information to acquire a fail bit prediction model further includes the following.

Step S8082: performing correlation probability analysis on repaired addresses in the address information of the adjacent bits and the redundant circuit information for repairing the adjacent bits, or performing mining analysis of repair processing rules.

Step S8084: acquiring the fail bit prediction model according to result of the analysis.

In the above embodiment, by analyzing redundant circuit selection of adjacent bits, it is possible, on the one hand, to determine features of redundant circuits that are more likely to cause the generation of adjacent bits so as to improve redundant circuits to hence enhance the overall reliability of the wafers, and on the other hand, when a redundant circuit is used next time to perform a repairing process, the redundant circuit information is input in the prediction model to predict addresses where adjacent bits may occur, to thereby enhance chip probing reliability and precision, and to enhance yield and acceptance rate of wafers.

According to an embodiment of the present disclosure, the address information includes at least one of coordinate information of bits, ID numbering information of bits, and wafer product types.

According to an embodiment of the present disclosure, the redundant circuit information includes at least one of redundant circuit version, repaired address, repair detection item, repaired bit count, and redundant circuit information version.

According to an embodiment of the present disclosure, the step of predicting fail bits to be chip-probed through the fail bit prediction model includes: collecting first repair information of a repaired new fail bit and second repair information of bits adjacent to the repaired new fail bit; analyzing the first repair information and the second repair information for input into the fail bit prediction model for prediction; and determining fail bit information according to output result of the fail bit prediction model.

According to an embodiment of the present disclosure, the step of analyzing the first repair information and the second repair information for input into the fail bit prediction model for prediction includes: analyzing the first repair information and the second repair information both as not being repaired, then output result of the fail bit prediction model being test flow phenomenon; analyzing the first repair information as being repaired by redundant circuit and the second repair information as not being repaired, then output result of the fail bit prediction model being fail bit phenomenon; and analyzing the first repair information as not being repaired and the second repair information as being repaired by redundant circuit, then output result of the fail bit prediction model being repair phenomenon.

According to an embodiment of the present disclosure, the step of determining fail bit information according to output result of the fail bit prediction model includes: analyzing and processing the output result; determining the fail bit information according to first corresponding relation between pre-stored test flow phenomena and fail bits if the analyzed output result includes the test flow phenomenon, wherein the test flow phenomena include a phenomenon in which the wafer fails after test flow; determining the fail bit information according to second corresponding relation between preset fail bit phenomena and fail bits if the analyzed output result includes the fail bit phenomenon, wherein the fail bit phenomena include a phenomenon in which a bit of the wafer having been repaired by redundant circuit fails; and determining the fail bit information according to third corresponding relation between preset repair phenomena and fail bits if the analyzed output result includes the repair phenomenon, wherein the repair phenomena include a phenomenon in which bits adjacent to a bit of the wafer having been repaired by redundant circuit fail.

Figure 9:
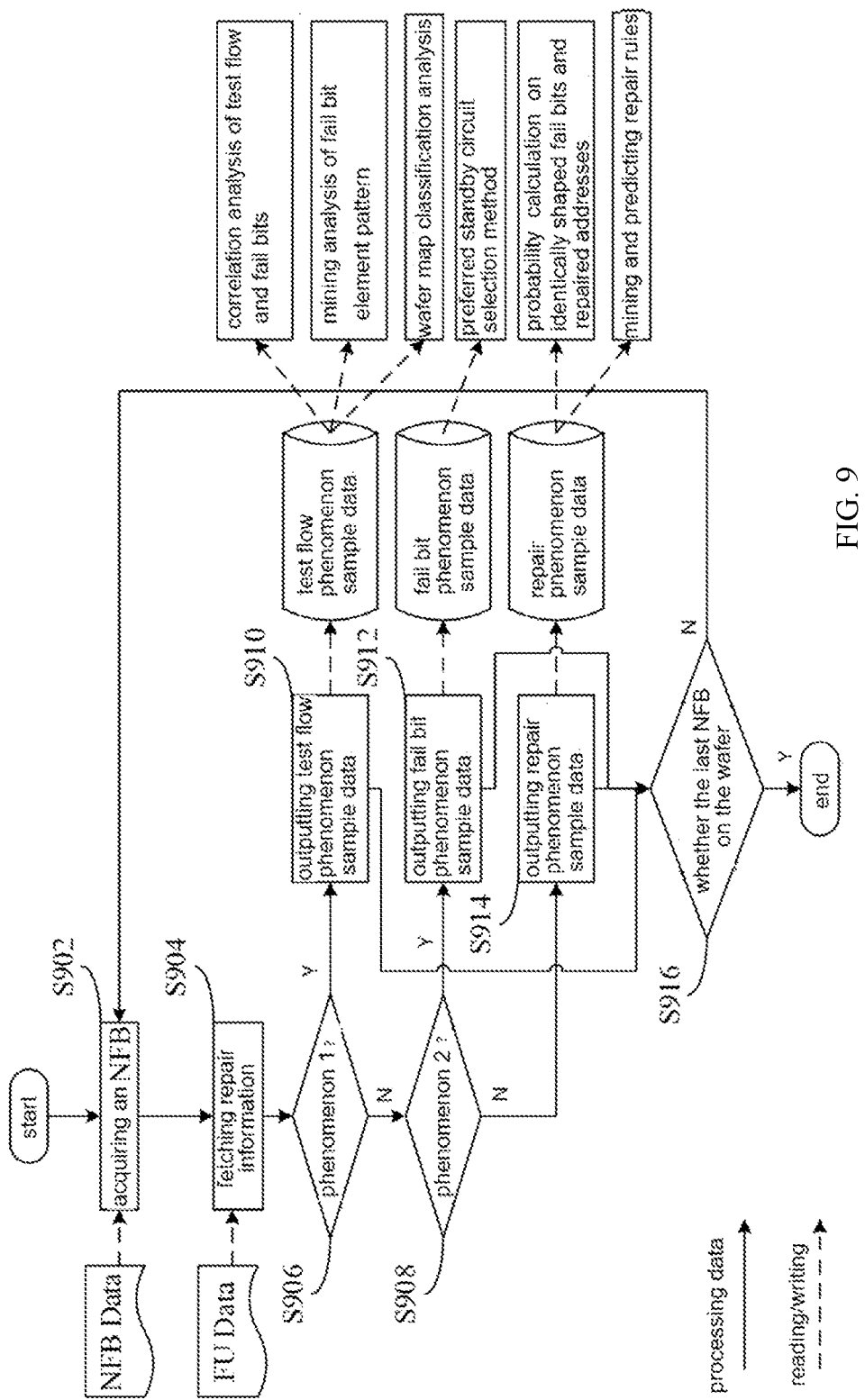
FIG. 9 is a flowchart schematically illustrating a still further processing method of chip probing data in some embodiments of the present disclosure.

As shown in FIG. 9, the processing solution of chip probing data according to the present disclosure includes, but is not restricted to, the following data processing, in-writing and out-reading processes:

(1) Source data includes NFB Data (new fail bit data) and FU data (full repair record data), but is not restricted thereto.

(2) System flow is mainly employed to execute data processing steps, which specifically include the following.

Step S902: acquiring one NFB.

Step S904: fetching repair information.

Step S906: judging whether conforming to phenomenon 1, if yes, executing Step S910, if not, executing Step S908.

Step S908: judging whether conforming to phenomenon 2, if yes, executing Step S912, if not, executing Step S914.

Step S910: outputting test flow phenomenon sample data.

Step S912: outputting fail bit phenomenon sample data.

Step S914: outputting repair phenomenon sample data.

Step S916: judging whether it is the last NFB on the wafer, if yes, ending process, if not, executing Step S902.

(3) Effective sample analysis includes: test flow phenomenon sample data, namely new fail bit data NFB Data that conforms to phenomenon 1; fail bit phenomenon sample data, namely new fail bit data NFB Data and corresponding repair record data FU Data that conform to phenomenon 2; repair phenomenon sample data, namely new fail bit data NFB Data and corresponding repair record data FU Data that conform to phenomenon 3.

(4) Machine learning system: correlation analysis of test flow and fail bits; mining analysis of element patterns of fail bits; wafer map classification analysis.

Some processing steps of the processing solution of chip probing data according to the present disclosure can be summarized as follows.

(1) Acquiring one NFB: sequentially acquiring one NFB information from source data FB data, the last acquired NFB being an ONFB.

(2) Fetching repair information: acquiring repaired bit address of the ONFB and repair information of associate bit addresses, and acquiring redundant circuit ID number using repair.

(3) Outputting test flow phenomenon sample data: outputting information of the ONFB to a test flow phenomenon sample database.

(4) Outputting fail bit phenomenon sample data: outputting such information as information of the ONFB, ONFB repaired bit address information, and its redundant circuit ID number for redundant use to a fail bit phenomenon sample database.

(5) Outputting repair phenomenon sample data: outputting such information as information of the ONFB, repair information of associate bit addresses, and its redundant circuit ID number for redundant use to a repair phenomenon sample database.

A processing apparatus 1000 of chip probing data according to the embodiment of the present disclosure is described below with reference to FIG. 10. The processing apparatus 1000 of chip probing data shown in FIG. 10 is merely exemplary in nature, and should not be construed as any restriction to the function and scope of application of the embodiments of the present disclosure.

Figure 10:
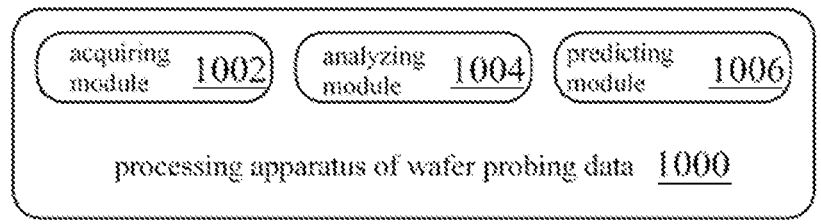
FIG. 10 is a block diagram schematically illustrating a processing apparatus of chip probing data in some embodiments of the present disclosure.

As shown in FIG. 10, the processing apparatus 1000 of chip probing data comprises an acquiring module 1002, an analyzing module 1004, and a predicting module 1006.

The acquiring module 1002 is employed for determining a new fail bit generated in an already completed chip probing process.

The acquiring module 1002 is further employed for acquiring repair record of the new fail bit, and repair records of bits adjacent to the new fail bit.

The analyzing module 1004 is employed for analyzing the repair records to determine attribute information of the new fail bit and attribute information of the adjacent bits, the attribute information including at least one of address information, redundant circuit information, element pattern of the new fail bit and chip probing flow.

The analyzing module 1004 is further employed for performing classification learning according to the attribute information to acquire a fail bit prediction model.

The predicting module 1006 is employed for predicting fail bits to be chip-probed through the fail bit prediction model.

An electronic equipment 1100 according to the embodiment of the present disclosure is described below with reference to FIG. 11. The electronic equipment 1100 shown in FIG. 11 is merely exemplary in nature, and should not be construed as any restriction to the function and scope of application of the embodiments of the present disclosure.

Figure 11:
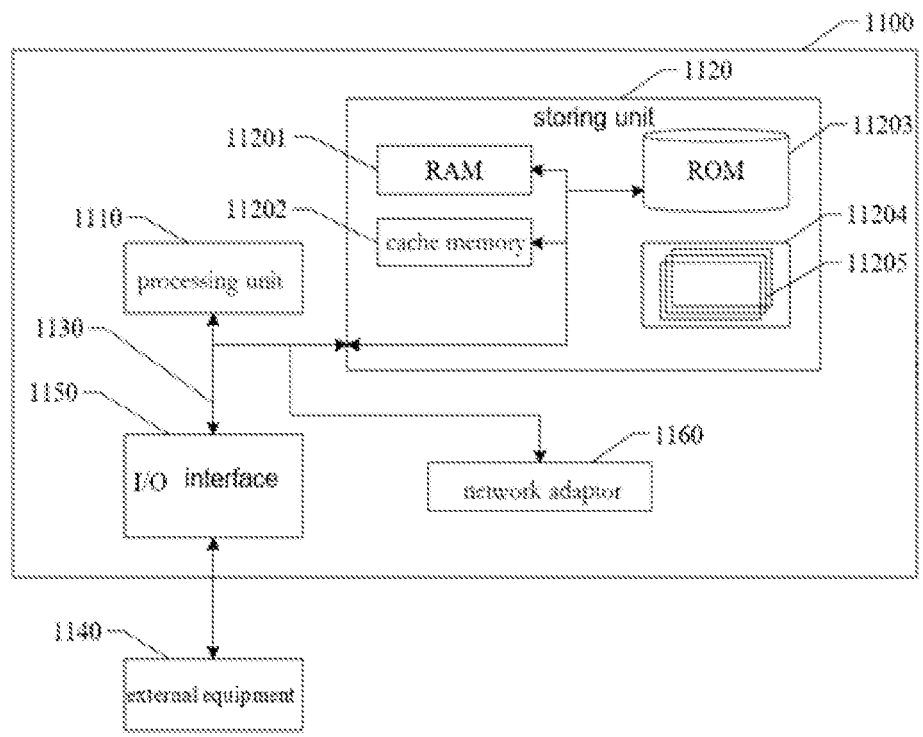
FIG. 11 is a block diagram schematically illustrating an electronic equipment in some embodiments of the present disclosure.

As shown in FIG. 11, the electronic equipment 1100 is embodied as a general-purpose computer equipment. Component parts of the electronic equipment 1100 can include, but are not limited to: a processing unit 1110, a storing unit 1120, a bus 1130 interconnecting component parts (including the storing unit 1120 and the processing unit 1110) of different systems for processing chip probing data.

The storing unit stores thereon a program code executable by the processing unit 1110, so that the processing unit 1110 executes the steps of the various exemplary embodiments of the present disclosure as described in this Description. For instance, the processing unit 1110 can execute the entire steps shown in FIGS. 2 to 8, and other steps defined in the processing method of chip probing data of the present disclosure.

The storing unit 1120 can include a readable medium in the form of a volatile storing unit, for example, a random access memory (RAM) 11201 and/or a cache memory 11202, and can further include a read-only memory (ROM) 11203.

The storing unit 1120 can further include a program/utility 11204 having a set of program modules 11205, such program modules 11205 include, but are not limited to, a processing system for operating chip probing data, one or more application programs, other program modules and program data; each or certain combination(s) of these examples may include implementation in a network environ.

The bus 1130 can be one or more that represent(s) several types of bus structures, including memory bus or memory controller, peripheral bus, graphics acceleration port, processing unit, or local bus that makes use of any bus structure in a plurality of bus structures.

The electronic equipment 1100 can also be communicative with one or more external equipment(s) 1140 (such as keyboard, pointing device, Bluetooth device, etc.), can further be communicative with one or more equipment(s) that enable(s) interaction between a user and the electronic equipment, and/or communicative with any equipment (such as router, modem etc.) that enables communication of the electronic equipment 1100 with one or more other computing equipment(s). Such communication can be performed via an input/output (I/O) interface 1150.

Moreover, the electronic equipment 1100 can further be communicative with a network adaptor 1160 and one or more network(s) (such as local area network (LAN), wide area network (WAN) and/or public network, such as internet). As shown in the Figure, the network adaptor 1160 is communicative with other modules of the electronic equipment 1100 via the bus 1130. As should be understood, although it is not shown in the Figure, it is possible to use other hardware and/or software modules in combination with the electronic equipment, and the hardware and/or software modules include, but are not limited to, microcode, device driver, redundant processing unit, external disc drive array, processing system of RAID chip probing data, tape drive, and processing system of data backup storage chip probing data, etc.

As easily comprehensible to persons skilled in the art through the description of the foregoing embodiments, the exemplary embodiments described here can be realized via software, and can also be realized via software in combination with necessary hardware. Accordingly, the technical solution according to the embodiments of the present disclosure can be embodied in the form of a software product, this software product can be stored in a nonvolatile storage medium (that can be a CD-ROM, a USB disk, a mobile hard disk drive, etc.) or on a network, and includes plural instructions enabling a computing equipment (that can be a personal computer, a server, a terminal device, or a network device, etc.) to execute the method according to the embodiments of the present disclosure.

In an exemplary embodiment of the present disclosure is further provided a computer-readable storage medium storing thereon a program product capable of realizing the above method described in the Description. In some possible embodiments, each aspect of the present disclosure can be further realized in the form of a program product that includes a program code. When the program product is run on a terminal device, the program code is employed to execute the steps of the various embodiments of the present disclosure as described in the Description.

Figure 12:
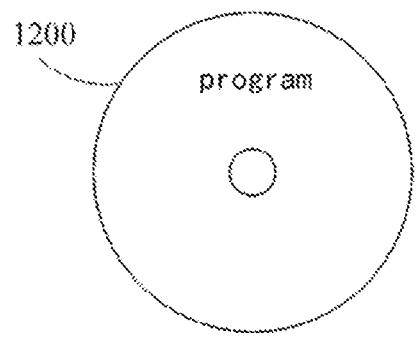
FIG. 12 is a diagram schematically illustrating a computer-readable storage medium in some embodiments of the present disclosure.

Referring to FIG. 12, a computer program 1200 according to an embodiment of the present disclosure is illustrated to be employed for realizing the aforementioned method, the computer program 1200 can be embodied as a portable compact disk read-only memory (CD-ROM) and includes a program code, and can be run on a terminal device, such as a personal computer. However, the program product of the present disclosure is not limited thereto; in this paper, the readable storage medium can be any tangible medium including or storing program thereon, the program can be instructed to execute the processing system and processing apparatus of chip probing data or a combined use thereof.

The computer-readable signal medium can include data signal in a baseband or transmitted as part of carrier wave, and includes therein a readable program code. Thus transmitted data signal can be embodied in a plurality of forms, including, but not limited to, electromagnetic signal, optical signal, or any suitable combination thereof. The readable signal medium can also be any readable medium except for the readable storage medium, and the readable medium can send, propagate or transmit a program instructed to execute the processing system and processing apparatus of chip probing data or a combined use thereof.

The program code included on the readable medium can be transmitted by any suitable medium, including, but not limited to, wired medium, wireless medium, cabled medium, RF medium, etc., or any suitable combination thereof.

One or any random combination of more programming languages can be employed to write the program code for executing the operation of the present disclosure, the programming language(s) include(s) such object-oriented programming languages as Java, C++ etc., and further include (s) conventional process programming languages such as "C" language or similar programming languages. The program code can be executed entirely on a user computing equipment, partially executed on a user equipment, executed as an independent software pack, executed partly on a user computing equipment and partly on a remote computing equipment, or executed entirely on a remote computing equipment or a server. In the case a remote computing equipment is involved, the remote computing equipment can be connected to the user computing equipment via a network of any type, including local area network (LAN) or wide area network (WAN), or connected to an external computing equipment (for instance, via internet connection provided by an internet service provider).

As should be noted, although plural modules or units of the apparatus for action execution are mentioned in detail in the above description, such division is not compulsory. As a matter of fact, according to the embodiments of the present disclosure, the features and functions of the aforementioned two or more modules or units can be crystallized in one module or unit. Vice versa, the features and functions of the aforementioned one module or unit can be further divided to be crystallized by plural modules or units.

In addition, although the various steps of the method in the present disclosure are illustrated in specific sequences in the accompanying drawings, it is not demanded or implied to execute these steps in the specific sequences, or to realize the desired result only by performing the entire illustrated steps. Additionally, or alternatively, certain steps can be dispensed with, plural steps can be incorporated into one step to be executed, and/or one step can be subdivided into plural steps to be executed.

It is easily comprehensible to persons skilled in the art, through the description of the foregoing embodiments, that the exemplary embodiments described here can be realized via software, and can also be realized via software in combination with necessary hardware. Accordingly, the technical solution according to the embodiments of the present disclosure can be embodied in the form of a software product, this software product can be stored in a nonvolatile storage medium (that can be a CD-ROM, a USB disk, a mobile hard disk drive, etc.) or on a network, and includes plural instructions enabling a computing equipment (that can be a personal computer, a server, a terminal device, or a network device, etc.) to execute the method according to the embodiments of the present disclosure.

The solution provided by the current disclosure enhances the efficiency for detecting fail bits of wafers and improves yield and acceptance rate of wafers by acquiring repair records of new fail bits generated in the chip probing process and adjacent bits, and by performing classification learning on the basis of the two types of repair records, so as to base on the classification learning result to predict fail bits, in other words, provided is a processing solution of chip probing data that is highly efficient and highly reliable.

After considering the description and practicing the contents disclosed here, persons skilled in the art would find it easy to conceive of other embodiments. The present disclosure is meant to cover any modifications, purposes of use or adaptable variations of the present disclosure, and these modifications, purposes of use or adaptable variations abide by the general principles of the present disclosure and include common knowledge in this field of specialty and frequently employed technical means not disclosed in the present disclosure. The Description and the embodiments are merely exemplary in nature, and the authentic scope and spirit of the present disclosure are pointed out in the attached claims.

What is claimed is:

1. A processing method of chip probing data, comprising:
   determining a new fail bit generated in an already completed chip probing process;
   acquiring repair record of the new fail bit, and repair records of bits adjacent to the new fail bit;
   analyzing the repair records to determine attribute information of the new fail bit and the adjacent bits, the attribute information including at least one of address information, redundant circuit information, element pattern of the new fail bit and chip probing flow;
   performing classification learning according to the attribute information to acquire a fail bit prediction model; and
   predicting fail bits to be chip-probed through the fail bit prediction model.

2. The processing method of chip probing data according to claim 1, wherein said analyzing the repair records to determine attribute information of the new fail bit and the adjacent bits includes:
   analyzing the repair records to detect whether the new fail bit has been processed by repairing, and to detect whether the adjacent bits have been processed by repairing; and
   acquiring address information and chip probing flow of the new fail bit in the attribute information if it is determined according to the repair records that the new fail bit has not been processed by repairing and that the adjacent bits have not been processed by repairing.

3. The processing method of chip probing data according to claim 2, wherein said performing classification learning according to the attribute information to acquire a fail bit prediction model includes:
   performing correlation analysis on the address information and the chip probing flow of the new fail bit; or
   performing mining analysis on the element pattern of the new fail bit; or
   performing wafer map classification analysis on the wafer to which the new fail bit pertains; and acquiring the fail bit prediction model according to result of the analysis.

4. The processing method of chip probing data according to claim 1, wherein said analyzing the repair records to determine attribute information of the new fail bit and the adjacent bits further includes:
   analyzing the repair records to detect whether the new fail bit has been processed by repairing; and
   determining address information of the new fail bit and redundant circuit information for repairing the new fail bit in the attribute information if it is determined according to the repair records that the new fail bit has been processed by repairing.

5. The processing method of chip probing data according to claim 4, wherein said performing classification learning according to the attribute information to acquire a fail bit prediction model further includes:
   performing redundant circuit selection analysis on the address information of the new fail bit and redundant circuit information for repairing the new fail bit; and
   acquiring the fail bit prediction model according to result of the analysis.

6. The processing method of chip probing data according to claim 1, wherein said analyzing the repair records to determine attribute information of the new fail bit and the adjacent bits further includes:
   analyzing the repair records to detect whether the new fail bit has been processed by repairing and to detect whether the adjacent bits have been processed by repairing; and
   determining address information of the adjacent bits and redundant circuit information for repairing the adjacent bits in the attribute information if it is determined according to the repair records that the new fail bit has not been processed by repairing and that the adjacent bits have been processed by repairing.

7. The processing method of chip probing data according to claim 6, wherein said performing classification learning according to the attribute information to acquire a fail bit prediction model further includes:
   performing correlation probability analysis on repaired addresses in the address information of the adjacent bits and the redundant circuit information for repairing the adjacent bits, or performing mining analysis of repair processing rules; and
   acquiring the fail bit prediction model according to result of the analysis.

8. The processing method of chip probing data according to claim 1, wherein the address information includes at least one of coordinate information of bits, ID numbering information of bits, and wafer product types.

9. The processing method of chip probing data according to claim 1, wherein the redundant circuit information includes at least one of redundant circuit version, repaired address, repair detection item, repaired bit count, and redundant circuit information version.

10. The processing method of chip probing data according to claim 1, further comprising:
    creating a reference coordinate system with coordinates of a bit at a lower left corner of the wafer as original coordinates;
    basing on the reference coordinate system to determine as x a horizontal coordinate of a row at which the new fail bit locates, and to determine as y a longitudinal coordinate of a column at which the new fail bit locates, x and y both being positive integers; and
    determining all bits of a column whose horizontal coordinate is x−1 and all bits of a column whose horizontal coordinate is x+1 as the adjacent bits.

11. The processing method of chip probing data according to claim 1, further comprising:
    creating a reference coordinate system with coordinates of a bit at a lower left corner of the wafer as original coordinates;
    basing on the reference coordinate system to determine as x a horizontal coordinate of a row at which the new fail bit locates, and to determine as y a longitudinal coordinate of a column at which the new fail bit locates, x and y both being positive integers;
    determining as N a serial number of a section to which the new fail bit pertains;
    determining as $x_0^N$ a horizontal coordinate of a bit at a left boundary of the section to which the new fail bit pertains;
    determining as $x_{max}^N$ a horizontal coordinate of a bit at a right boundary of the section to which the new fail bit pertains; and
    determining all bits whose longitudinal coordinate is y−1 and whose horizontal coordinate is $x_0^N$ to $x_{max}^N$, and all bits whose longitudinal coordinate is y+1 and whose horizontal coordinate is $x_0^N$ to $x_{max}^N$ as the adjacent bits.

12. The processing method of chip probing data according to claim 1, further comprising:
    creating a reference coordinate system with coordinates of a bit at a lower left corner of the wafer as original coordinates;
    basing on the reference coordinate system to determine as x a horizontal coordinate of a row at which the new fail bit locates, and to determine as y a longitudinal coordinate of a column at which the new fail bit locates, x and y both being positive integers;
    determining as N−1 a serial number of a section to the left of a section to which the new fail bit pertains;
    determining as N+1 a serial number of a section to the right of a section to which the new fail bit pertains;
    determining as $x_0^{N-1}$ a horizontal coordinate of a bit at a left boundary of the left section;
    determining as $x_{max}^{N-1}$ a horizontal coordinate of a bit at a right boundary of the left section;
    determining as $x_0^{N+1}$ a horizontal coordinate of a bit at a left boundary of the right section;
    determining as $x_{max}^{N+1}$ a horizontal coordinate of a bit at a right boundary of the right section; and
    determining all bits whose longitudinal coordinate is y and whose horizontal coordinate is $x_0^{N-1}$ to $x_{max}^{N-1}$, and all bits whose horizontal coordinate is $x_0^{N+1}$ to $x_{max}^{N+1}$ as the adjacent bits.

13. The processing method of chip probing data according to claim 1, wherein said predicting fail bits to be chip-probed through the fail bit prediction model includes:
    collecting first repair information of a repaired new fail bit and second repair information of bits adjacent to the repaired new fail bit;
    analyzing the first repair information and the second repair information for input into the fail bit prediction model for prediction; and
    determining fail bit information according to output result of the fail bit prediction model.

14. The processing method of chip probing data according to claim 13, wherein said analyzing the first repair information and the second repair information for input into the fail bit prediction model for prediction includes:

analyzing the first repair information and the second repair information both as not being repaired, then output result of the fail bit prediction model being test flow phenomenon;
analyzing the first repair information as being repaired by redundant circuit and the second repair information as not being repaired, then output result of the fail bit prediction model being fail bit phenomenon; and
analyzing the first repair information as not being repaired and the second repair information as being repaired by redundant circuit, then output result of the fail bit prediction model being repair phenomenon.

15. The processing method of chip probing data according to claim 14, wherein said determining fail bit information according to output result of the fail bit prediction model includes:
analyzing and processing the output result;
determining the fail bit information according to first corresponding relation between pre-stored test flow phenomena and fail bits if the analyzed output result includes the test flow phenomenon, wherein the test flow phenomena include a phenomenon in which the wafer fails after test flow;
determining the fail bit information according to second corresponding relation between preset fail bit phenomena and fail bits if the analyzed output result includes the fail bit phenomenon, wherein the fail bit phenomena include a phenomenon in which a bit of the wafer having been repaired by redundant circuit fails; and
determining the fail bit information according to third corresponding relation between preset repair phenomena and fail bits if the analyzed output result includes the repair phenomenon, wherein the repair phenomena include a phenomenon in which bits adjacent to a bit of the wafer having been repaired by redundant circuit fail.

16. A non-transitory computer-readable storage medium, storing thereon a computer program that realizes the processing method of chip probing data according to claim 1 upon execution by a processor.

* * * * *